United States Patent

Horr et al.

Patent Number: 5,515,302
Date of Patent: May 7, 1996

[54] METHOD FOR IDENTIFYING EXCESSIVE POWER CONSUMPTION SITES WITHIN A CIRCUIT

[75] Inventors: Donald E. Horr; Larry Maturo; Kirk Livingston, all of Austin, Tex.

[73] Assignee: Motorola, Inc., Schaumburg, Ill.

[21] Appl. No.: 334,987

[22] Filed: Nov. 7, 1994

[51] Int. Cl.⁶ .............................. G06G 7/48; G06F 15/00
[52] U.S. Cl. ..................... 364/578; 364/488; 395/750; 326/56; 326/21; 327/537; 327/546; 331/1 A; 371/25.1
[58] Field of Search ..................... 364/488, 489, 364/490, 491, 578, 483; 395/750; 455/343; 331/1 A, 14–27; 324/537, 73.1; 257/148, 207, 208, 920; 326/56, 21; 371/25.1; 327/537, 546, 7; 365/210, 185, 230.03; 379/29, 18

[56] References Cited

U.S. PATENT DOCUMENTS

| | | | |
|---|---|---|---|
| 4,429,281 | 1/1984 | Ito et al. | 327/337 |
| 4,542,485 | 9/1985 | Iwahashi et al. | 365/189.09 |
| 4,612,618 | 9/1986 | Pryor et al. | 364/49 |
| 4,631,686 | 12/1986 | Ikawa et al. | 364/490 |
| 4,639,557 | 1/1987 | Butler et al. | 379/29 |
| 4,698,760 | 10/1987 | Lembach et al. | 364/490 |
| 4,743,864 | 5/1988 | Nakagawa et al. | 331/1 A |
| 4,827,428 | 5/1989 | Dunlop et al. | 364/491 |
| 4,922,432 | 5/1990 | Kobayashi et al. | 364/490 |
| 4,961,053 | 10/1990 | Krug | 324/537 |
| 5,005,136 | 4/1991 | Van Berkel et al. | 364/490 |
| 5,119,314 | 6/1992 | Hotta et al. | 364/491 |
| 5,264,743 | 11/1993 | Nakagome et al. | 327/537 |
| 5,349,542 | 9/1994 | Brasen et al. | 364/578 |
| 5,383,137 | 1/1995 | Burch | 364/578 |
| 5,392,221 | 2/1995 | Donath et al. | 364/489 |
| 5,428,560 | 6/1995 | Leon et al. | 364/578 |
| 5,432,328 | 7/1995 | Yamaguchi | 235/449 |

OTHER PUBLICATIONS

Designing in Power–down Test Circuits, Paul S. Levy, VLSI Technoloy Inc. IEEE Sep. 1991.
Ruehli et al., "Analytical Power/Timing Optimization Technique for Digital System", pp. 142–146.
Matson, "Optimization of Digital MOS VLSI Circuits", Chapel Hill Conference, 1985, pp. 109–115.

Primary Examiner—Kevin J. Teska
Assistant Examiner—Jacques H. Louis-Jacques

[57] ABSTRACT

A method for minimizing power consumption in a circuit is accomplished by identifying, based on the test parameters and topology information for the circuit, potential excessive power consuming sites. Next, the potential excessive power consuming sites, or potential leakage current sites, are monitored, based on the test parameters, for indeterminate logic states which result in leakage current and excessive power consumption. A report is generated detailing the locations of any leakage current sites, whereby the circuit may be modified to eliminate the leakage current sites prior to fabrication.

11 Claims, 2 Drawing Sheets

METHOD FOR IDENTIFYING EXCESSIVE POWER CONSUMPTION SITES WITHIN A CIRCUIT

TECHNICAL FIELD OF THE INVENTION

This invention relates generally to circuit design, and more specifically to a method for reducing power consumption in circuits.

BACKGROUND OF THE INVENTION

Portable electronic devices are commonly used for verbal and written communication, scheduling, note taking, etc. A portable electronic device often derives its power from a battery, wherein the battery contains a finite amount of power and must be recharged or replaced when it is depleted. The size of the battery often determines the amount of power it can source, but larger batteries, which can source more power, add considerable weight and size, reducing the convenience of the portable electronic device. For this reason, smaller, less cumbersome batteries are often preferred, but these smaller batteries are often more costly than commercially available large batteries and are limited in their power sourcing capacity.

Considering the limited amount of power that can be sourced by a practically sized and priced battery, reducing power consumption is an important design factor when developing portable electronic devices. If the circuitry in a portable electronic device consumes unnecessary power, or power that doesn't contribute to the functionality of the device, the lifetime of the battery is reduced, which in turn limits the usefulness of the device.

Unnecessary power consumption can be due to leakage current. Leakage current can occur when a device in the circuit is not driven and decays to an unknown, or indeterminate, logic state. In this unknown logic state, the device may be partially "on" thus forming a current path between a supply and a return. As current flows through the path, unnecessary power is consumed.

To eliminate the excess power consumption, the indeterminate states that cause leakage current must be eliminated. While this may sound like a trivial task, it is most complex in an integrated circuit having millions of transistors. In such complex circuits the indeterminate states may occur as a result of propagation delays, parasitic capacitance, etc.

A prior art technique for detecting indeterminate states that cause leakage current on circuits utilizes a low-light or infrared camera to monitor a device that has already been produced. When this technique is used, sites where leakage current is present, i.e. has an indeterminate state, will appear as "hot-spots" or bright areas which can be detected by the camera. These hot-spots are the result of heat generated when power is consumed at the leakage current sites. While the technique identifies leakage current sites, it cannot be performed until after the circuit has already been fabricated, which makes correction of the indeterminate state both time consuming and costly. In addition, as circuits are developed through multi-layer integrated circuit processes or are created on multi-layer boards, it becomes more difficult for cameras to discern which layer the hot-spots are actually on. In addition, the camera method provides little insight as to why the hot spot has occurred.

Another prior art technique involves identifying all of the nodes in a circuit that produce an indeterminate state during simulation. While this technique identifies nodes that produce an indeterminate state, these nodes may not draw any leakage current because they do not produce a conductive path from the supply to the return. In order to identify leakage current sites, the identified nodes must be further analyzed which, for a multi-million transistor integrated circuit, is time consuming and requires post-processing of the indeterminate state information.

Therefore, a need exists for a method that automatically identifies leakage current sites in a circuit prior to fabrication, minimizes the additional time and effort necessary to do so, eliminates the requirement for post-processing, and provides information as to why the leakage current site occurred.

DETAILED DESCRIPTION OF THE DRAWINGS

Generally, the present invention provides a method for identifying excessive power consuming sites to minimize power consumption in a circuit. This is accomplished by identifying, based on the test parameters and topology information for a circuit, a potential excessive power consuming site. Next, the potential excessive power consuming site, or potential leakage current site, is monitored, based on the test parameters, for an indeterminate logic state which results in leakage current and excessive power consumption. A report is generated detailing the locations of any leakage current sites, allowing the circuit to be modified. With such a method, leakage current sites may be identified and corrected, prior to fabrication, in a manner which requires less effort and cost than the mentioned prior art techniques.

Figure 1:
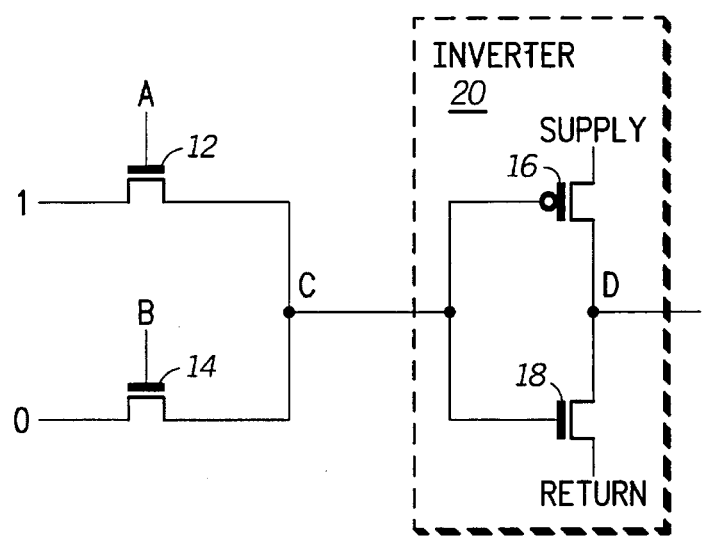
FIG. 1 illustrates a circuit that may consume excessive power.

FIG. 1 illustrates a potential leakage current site. In general, a potential leakage current site 10 will exist wherever there are discrete transistor elements 12–14 or devices that have discrete transistors as inputs. Node C in FIG. 1, which is the input to the inverter device 20, is a potential leakage current site, as it has two discrete transistors 12, 14 as inputs. If signal A and B are active, transistor 12 attempts to drive node C to a "1", while transistor 14 attempts to drive node C to a "0" value. With signals A and B active, node C will decay to an indeterminate logic state causing both transistors 16 and 18 to partially conduct, thus forming a leakage current path from a supply to a return. In this state, the inverter 20 is drawing leakage current and thus is consuming excessive power.

If neither signal A nor signal B is active, node C will not be driven to a definitive state. In this condition, node C is referred to as a floating node, and will decay to an indeterminate logic state, thus causing the inverter 20 to draw leakage current and consume excessive power.

If either node A or node B is active, but A and B are not active at the same time, the state of C is known, and only one of the transistors of the inverter that drives node D is conducting. With only one of the two transistors in the inverter conducting, there is no path from supply to return, and no leakage occurs.

Figure 2:
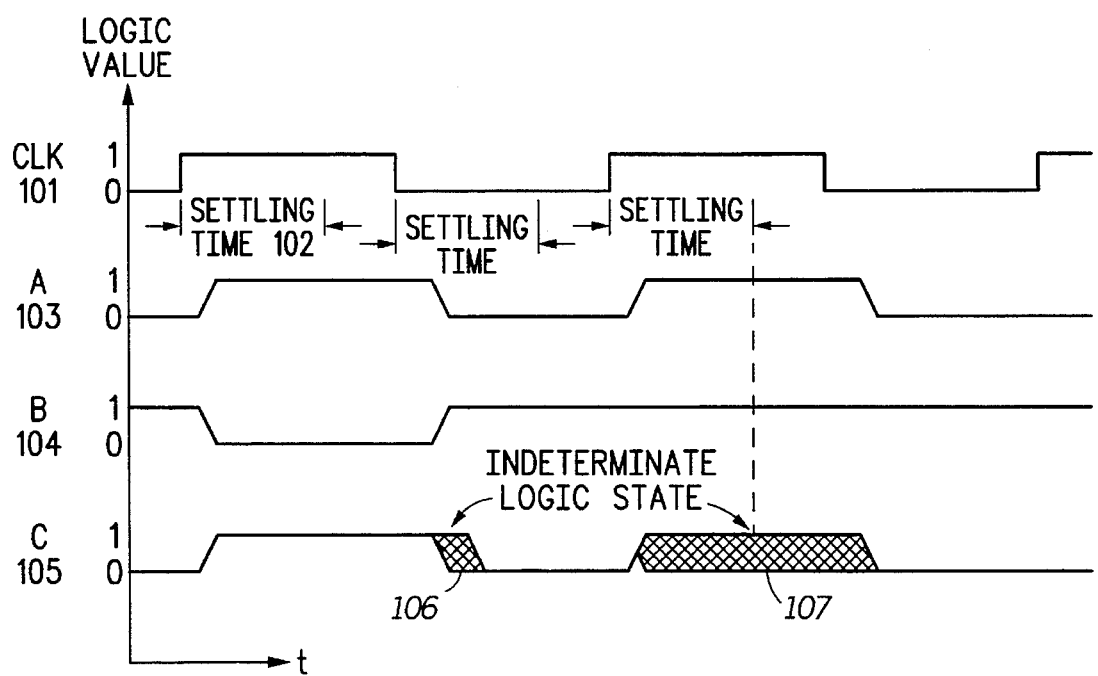
FIG. 2 illustrates, in a timing diagram, an indeterminate logic state in accordance with the present invention.

FIG. 2 illustrates a timing diagram of the indeterminate logic states 106 and 107 that can result in the circuit of FIG. 1. The timing diagram comprises a clock signal (CLK) 101, signal A 103, signal B 104, and node C 105, where inputs A 103 and B 104 are triggered on the rising and falling edges of CLK 101.

An indeterminate logic state 106–107 will exist at C 105 whenever signal A 103 and signal B 104 are both active. Indeterminate logic state 106 is the result of signal A 103 and signal B 104 switching simultaneously, and evolves to a determinate state as soon as A 103 and B 104 settle. This transitional indeterminate logic state 106 results in minimal power consumption, and therefore is not grounds for including node C 105 as a leakage current site. Indeterminate logic state 107, which results because both A 103 and B 104 are active, will remain indeterminate until either A 103 or B 104 transitions to a low or inactive state. Indeterminate state 107 causes the inverter 20 to consume excessive power and thus is identified as a leakage current site.

In order to distinguish the transitional indeterminate logic state 106 from the indeterminate logic state 107 that causes leakage current, CLK 101 includes a settling time parameter 102. The settling time 102 is a fraction of the clock period wherein the input signals, after switching, are allowed to settle to their determinate values. When the test parameters and circuit topology are examined for indeterminate logic states, indeterminate logic states that occur within the settling time 102 are assumed to be due to transitions on the inputs and are disregarded, while indeterminate states that occur after the settling time are identified as leakage current sites.

Figure 3:
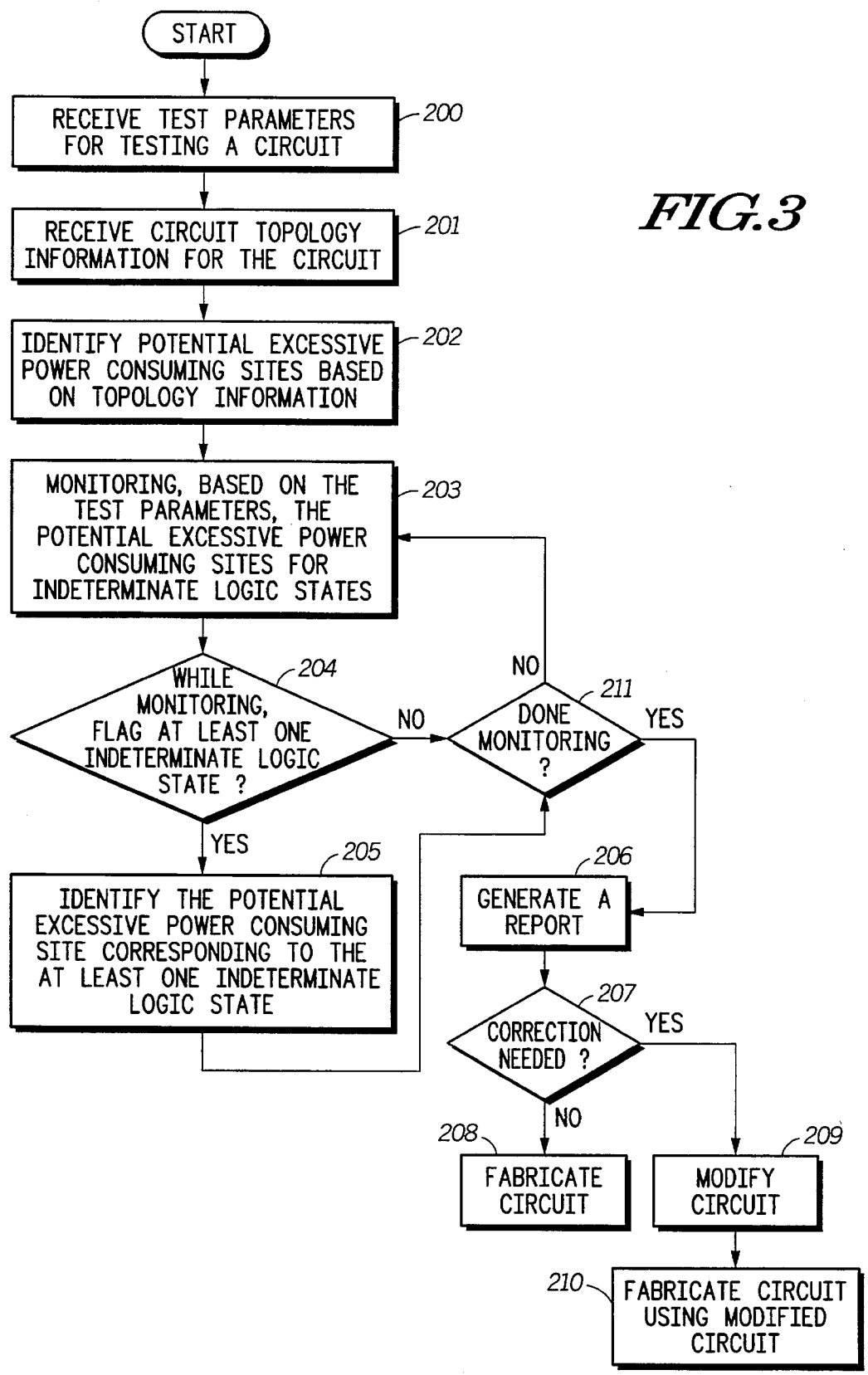
FIG. 3 illustrates, in a logic diagram, a method for minimizing power consumption in a circuit in accordance with the present invention.

FIG. 3 illustrates, in a logic diagram, a method for eliminating leakage current sites in a circuit, integrated circuit, or multi-layer integrated circuit. At step 200, test parameters for testing a circuit are received. The test parameters comprise both parameters for inputs to the circuit and parameters for the clock that is coupled to the circuit. The clock parameters include both a clock rate and a settling time, wherein the settling time is less than the period of the clock. The test parameters may be VERILOG™ test vectors for the circuit, which are vectors formatted specifically to be used with the VERILOG™ logic simulation algorithm. The percentage of nodes in the circuit that can be verified as not being leakage current sites is dependent on the percentage of circuit nodes exercised by the VERILOG™ test vectors, wherein the more nodes exercised by the test vectors, the better the leakage current detection coverage.

In step 201, the topology information of the circuit is received in a textual netlist format. The topology information is comprised of: all of the elements in the circuit, wherein the elements include at least logic gates and transistors; the inputs and outputs to the circuit, which include clock signals; and the interconnect coupling the elements, inputs, and outputs. This topology information may be a VERILOG™ netlist, which is formatted for use with the VERILOG™ logic simulation algorithm.

At step 202, potential excessive power consuming sites, or leakage current sites, are identified based on the circuit topology information. This is achieved by searching the VERILOG™ netlist for instances of discrete transistor elements coupled to a supply or a return and devices that have discrete transistors as inputs. If an indeterminate logic state could result in a path from supply to return at one of these instances, the instance is identified as a potential excessive power consuming site.

In step 203, the potential excessive power consuming sites are monitored, based on the test parameters, to determine if an indeterminate logic state occurs. In the VERILOG™ platform, step 203 involves running a logic simulation using the VERILOG™ test parameters, or vectors, as stimulus for the VERILOG™ netlist. While the logic simulation is running, the potential excessive power consuming sites are monitored, and if an indeterminate logic state is present at a potential excessive power consuming site after the settling time of the clock, it is flagged. For example assume that the settling time of the clock is 20 ns and a clock edge occurs every 25 ns. For the first 20 ns after every clock edge, indeterminate logic states are ignored, but for the 5 ns that exists between the settling time and the next clock edge, an indeterminate logic state at the potential excessive power consuming site will be flagged.

While monitoring the potential excessive power consuming sites, it is determined at step 204 if an indeterminate logic state has been flagged. If one has been flagged, the potential excessive power consuming site to which the indeterminate logic state corresponds is identified at step 205 as an excessive power consuming, or leakage current, site.

In step 211, it is decided whether or not the monitoring step has been completed. If the test parameters have not been exhausted, or if the VERILOG™ simulation has not completed, the monitoring step continues. Once the test parameters are exhausted, a report is generated at step 206. The report includes all leakage current sites, if any, and may also include the test parameters that caused the indeterminate logic state to appear at each identified leakage current site.

At step 207, it is determined, based on the report, if the circuit needs correction before fabrication. If no leakage current sites are found, no correction is needed, and at step 208, the circuit is fabricated. If corrections are needed, the circuit is modified at step 209 to eliminate the leakage current sites, and the modified circuit is fabricated at step 210.

The present invention provides a method for reducing power consumption in a circuit. With such a method, leakage current sites are automatically identified in a circuit prior to fabrication, the additional time and effort necessary to do so is minimized, and the requirement for post-processing is eliminated.

We claim:

1. A method for identifying excessive power consumption sites within a circuit, the method comprising the steps of:
receiving test parameters for a logic simulation algorithm, wherein the logic simulation algorithm is used to test the circuit;
receiving circuit topology information of the circuit;
identifying a potential excessive power consuming site based on at least a portion of the circuit topology information;
while the logic simulation algorithm is testing the circuit, monitoring, based on at least a portion of the test parameters, the potential excessive power consuming site for an indeterminate logic state, the indeterminate logic state resulting in leakage current between any power supply conductor and any supply return conductor at the potential excessive power consuming site; and
when the indeterminate logic state is determined, identifying the potential excessive power consuming site as a site that is consuming excessive power due to the leakage current.

2. The method of claim 1, wherein the receiving test parameters step further comprises receiving input parameters and clock parameters as the test parameters.

3. The method of claim 2, wherein the receiving of clock parameters further comprises receiving a clock rate and a settling time.

4. The method of claim 3, wherein the monitoring the potential excessive power consuming site further comprises delaying the monitoring until the settling time has elapsed.

5. The method of claim 1 further comprises generating a report that details location of the potential excessive power consuming site.

6. The method of claim 1, wherein the identifying the potential excessive power consuming site as the site that is consuming excessive power further comprises identifying, for the potential excessive power consuming site, test parameters of the at least a portion of the test parameters causing the indeterminate logic state.

7. The method of claim 1, wherein the receiving circuit topology information further comprises receiving circuit topology information of an integrated circuit.

8. The method of claim 7, wherein the receiving circuit topology information further comprises receiving circuit topology information of a multi-layer integrated circuit.

9. A method for identifying excessive power consumption sites within a circuit, the method comprising the steps of:

receiving test parameters for a logic simulation algorithm, wherein the logic simulation algorithm is used to test the circuit; receiving circuit topology information of the circuit;

identifying a potential excessive power consuming site based on at least a portion of the circuit topology information by searching the at least a portion of the circuit topology information for a transistor coupled to a gate of another transistor, for a transistor coupled to a power supply, or for a transistor coupled to a return;

while the logic simulation algorithm is testing the circuit, monitoring, based on at least a portion of the test parameters, the potential excessive power consuming site for an indeterminate logic state, the indeterminate logic state resulting in leakage current between the power supply and the return at the potential excessive power consuming site; and when the indeterminate logic state is determined, identifying the potential excessive power consuming site as a site that is consuming excessive power due to the leakage current.

10. A method for producing an integrated circuit, the method comprising the steps of:

a) receiving test parameters for a logic simulation algorithm, wherein the logic simulation algorithm is used to test the integrated circuit;

b) receiving integrated circuit topology information of the integrated circuit;

c) identifying a potential excessive power consuming site based on at least a portion of the integrated circuit topology information;

d) while the logic simulation algorithm is testing the integrated circuit, monitoring, based on at least a portion of the test parameters, the potential excessive power consuming site for an indeterminate logic state;

e) when the indeterminate logic state is determined, identifying the potential excessive power consuming site as a site that is consuming excessive power due to leakage current resulting from the indeterminate logic state;

f) when the indeterminate logic state is determined, modifying the integrated circuit to eliminate the indeterminate logic state to produce a modified integrated circuit topology; and g) fabricating the integrated circuit using the modified integrated circuit topology.

11. A method for testing a multi-layer integrated circuit, the method comprising the steps of:

a) receiving test parameters for a logic simulation algorithm, wherein the logic simulation algorithm is used to test the multi-layer integrated circuit;

b) receiving multi-layer integrated circuit topology information of the multi-layer integrated circuit;

c) identifying a potential excessive power consuming site based on at least a portion of the multi-layer integrated circuit topology information;

d) while the logic simulation algorithm is testing the multi-layer integrated circuit, monitoring, based on at least a portion of the test parameters, the potential excessive power consuming site for an indeterminate logic state that results in leakage current;

e) when the indeterminate logic state is determined, identifying the potential excessive power consuming site as a site that is consuming excessive power due to the leakage current; and f) when the indeterminate logic state is determined, modifying the multi-layer integrated circuit to eliminate the indeterminate logic state to produce a modified multi-layer integrated circuit topology.

* * * * *